United States Patent
Wallace, Jr. et al.

(10) Patent No.: US 6,356,100 B1
(45) Date of Patent: Mar. 12, 2002

(54) GROUND BOUNCE REDUCTION TECHNIQUE USING PHASED OUTPUTS AND PACKAGE DE-SKEWING FOR SYNCHRONOUS BUSES

(75) Inventors: Douglas Elmer Wallace, Jr.; James Bryce Mobley, both of Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/766,181

(22) Filed: Jan. 19, 2001

(51) Int. Cl.[7] .............................................. H03K 17/18
(52) U.S. Cl. ............................. 326/26; 326/28; 326/86; 326/93
(58) Field of Search ............................... 326/26–28, 82, 326/83, 86, 93, 95, 98

(56) References Cited

U.S. PATENT DOCUMENTS

| | | | |
|---|---|---|---|
| 4,820,944 A | * 4/1989 | Herlein et al. ................ 326/93 |
| 5,191,657 A | 3/1993 | Ludwig et al. | |
| 5,237,670 A | 8/1993 | Wakerly | |
| 5,255,375 A | 10/1993 | Crook et al. | |
| 5,265,216 A | 11/1993 | Murphy et al. | |
| 5,313,501 A | * 5/1994 | Thacker ....................... 326/93 |
| 5,362,996 A | * 11/1994 | Yizraeli ....................... 326/27 |
| 5,465,346 A | 11/1995 | Parks et al. | |
| 5,646,543 A | * 7/1997 | Rainal ......................... 326/26 |
| 5,696,951 A | * 12/1997 | Miller ......................... 327/161 |

* cited by examiner

Primary Examiner—Michael Tokar
Assistant Examiner—Don Phu Le
(74) Attorney, Agent, or Firm—Haynes and Boone, LLP

(57) ABSTRACT

A technique for reducing such ground bounce using phased outputs and package de-skewing for source synchronous buses is described. In one embodiment, the output buffers of an integrated circuit ("IC") are phased so that half of the buffer outputs are driven first and the remaining half are driven a slight time delay later. The outputs are then de-skewed by package routing so that the earlier signals reach the package pins at the same time as the later signals. This deskewing is accomplished by serpentining and length-matching the bank of non-delayed outputs so that these trace-induced delays match an optimized fixed clock delay used to delay the bank of delayed outputs, the traces of which are length-matched and routed as short as possible.

20 Claims, 4 Drawing Sheets

US 6,356,100 B1

GROUND BOUNCE REDUCTION TECHNIQUE USING PHASED OUTPUTS AND PACKAGE DE-SKEWING FOR SYNCHRONOUS BUSES

BACKGROUND

The disclosures herein relate generally to ground bounce caused by simultaneous switching of I/O buffers in complex integrated circuits and, more particularly, to a technique for reducing such ground bounce using phased outputs and package de-skewing for source synchronous buses.

Simultaneous switching of I/O buffers in complex integrated circuits create sudden shifts in the ground and power plane voltages. These shifts, generically referred to as "ground bounce," cause relative shifts in the output buffers signals to the extent that a "0" can be detected as a "1" and vice versa, causing data errors. This problem is becoming increasingly troublesome due to lowered signal voltage levels and their consequent lower noise margins and the increase in density of I/O in increasingly complex chips. The worst ground bounce scenarios occur when most or all I/O buffers drive their output simultaneously.

Prior methods of addressing the above-described problem include adjusting the slew rate of individual I/O buffers, increasing the interplane capacitance using on-chip capacitors, and increasing the decoupling in the immediate region of the transmitting chip. These prior art solutions suggest the use of long phase delay periods on the order of the ground bounce resonance period, but do not include phase de-skewing and are therefore not exceedingly practical without a major revision of bus timing and protocol.

Therefore, what is needed is a technique for reducing such ground bounce using phased outputs and package de-skewing for source synchronous buses.

SUMMARY

One embodiment, accordingly, is a technique for reducing such ground bounce using phased outputs and package de-skewing for source synchronous buses. In this embodiment, the output buffers of an integrated circuit ("IC") are phased so that half of the buffer outputs are driven first and the remaining half are driven a slight time delay later. The outputs are then de-skewed by package routing so that the earlier signals reach the package pins at the same time as the later signals. This de-skewing is accomplished by serpentining and length-matching the bank of non-delayed outputs so that these trace-induced delays match an optimized fixed clock delay used to delay the bank of delayed outputs, the traces of which are length-matched and routed as short as possible.

In an alternative embodiment, the addition of a programmable additional clock delay over and above the fixed value allows for greater phase delay values to be selected by the system designer that can then be de-skewed by additional trace length on the printed circuit board ("PCB").

In another embodiment, the clock delay is eliminated and a similar result is achieved by delaying each data signal individually.

A principal advantage of the embodiment is that it accomplishes significant reduction in ground bounce without overlooking the necessity to perform phase de-skewing at the output of an IC.

DETAILED DESCRIPTION

Figure 1:
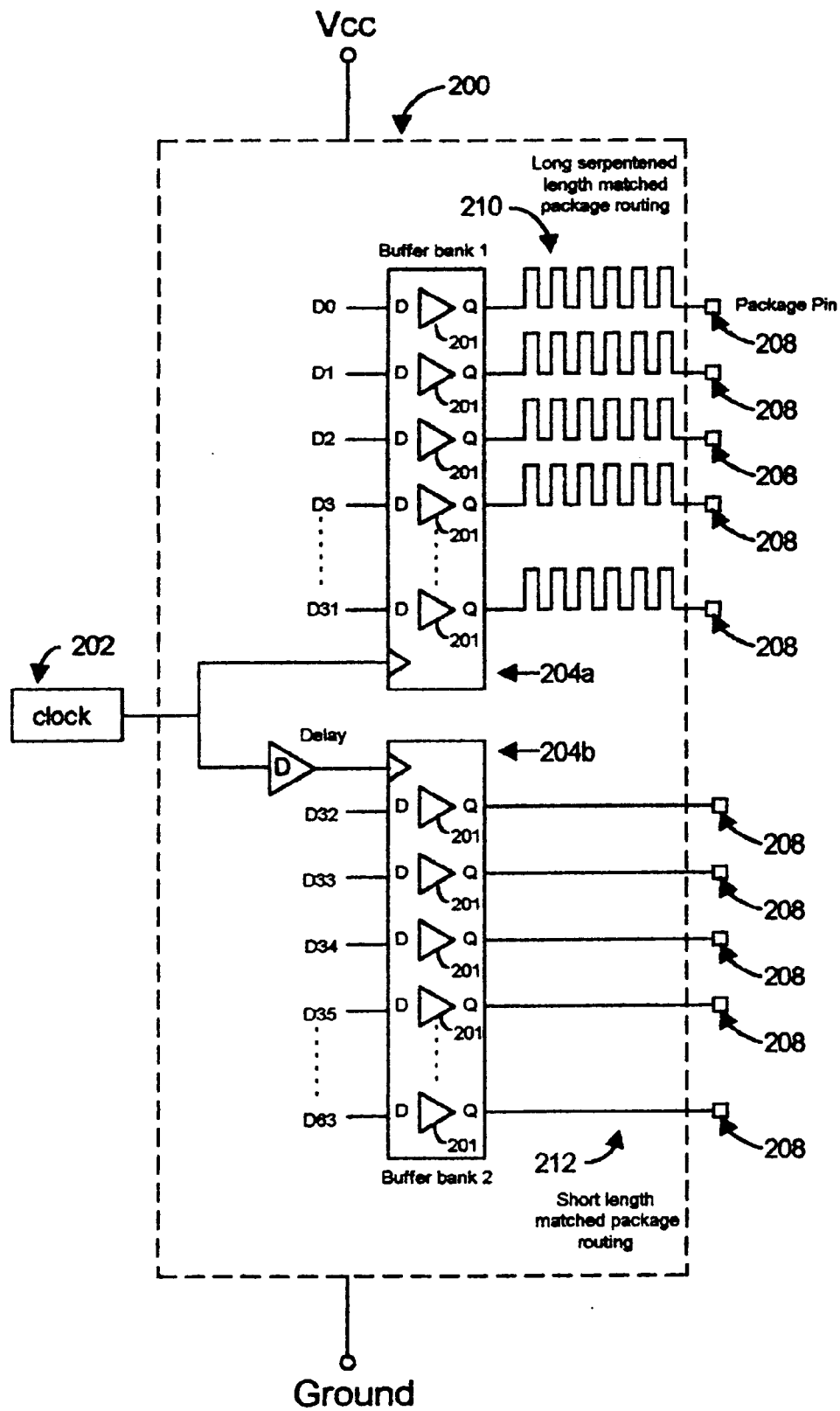
FIG. 1 is a schematic diagram of a buffer implementing a ground bounce reduction technique embodying features of one embodiment.

As shown in FIG. 1, an IC package is designated by a reference numeral 200. Each of a plurality of data bits D0–D63 is clocked into a respective buffer 201 using a clock signal generated by a clock 202. In one embodiment, the output buffers 201 are divided into two banks 204a, 204b. In accordance With the embodiment, a delay D is introduced in the clock signal supplied to the second bank 204a, such that if the buffers 201 of the first bank 204a are driven at a time T, then the buffers of the other bank 204b are driven at a time T+D. The data output from the buffers 201 is de-skewed before it is output from the IC package 200 so that the data signals clocked out of the first bank 204a of buffers 201 reach respective data output pins 208 of the IC package 200 at the same time as those clocked out of the second bank 204b of buffers. This is accomplished providing serpentined and length-matched traces 210 between the outputs of the buffers 201 of the first bank 204a and their respective package pins 208 the so that the trace-induced delays match the delay D, whereas the traces 212 between the outputs of the buffers 201 of the second bank 204b and their respective package pins 208 are length-matched and routed as short as possible.

Figure 2:
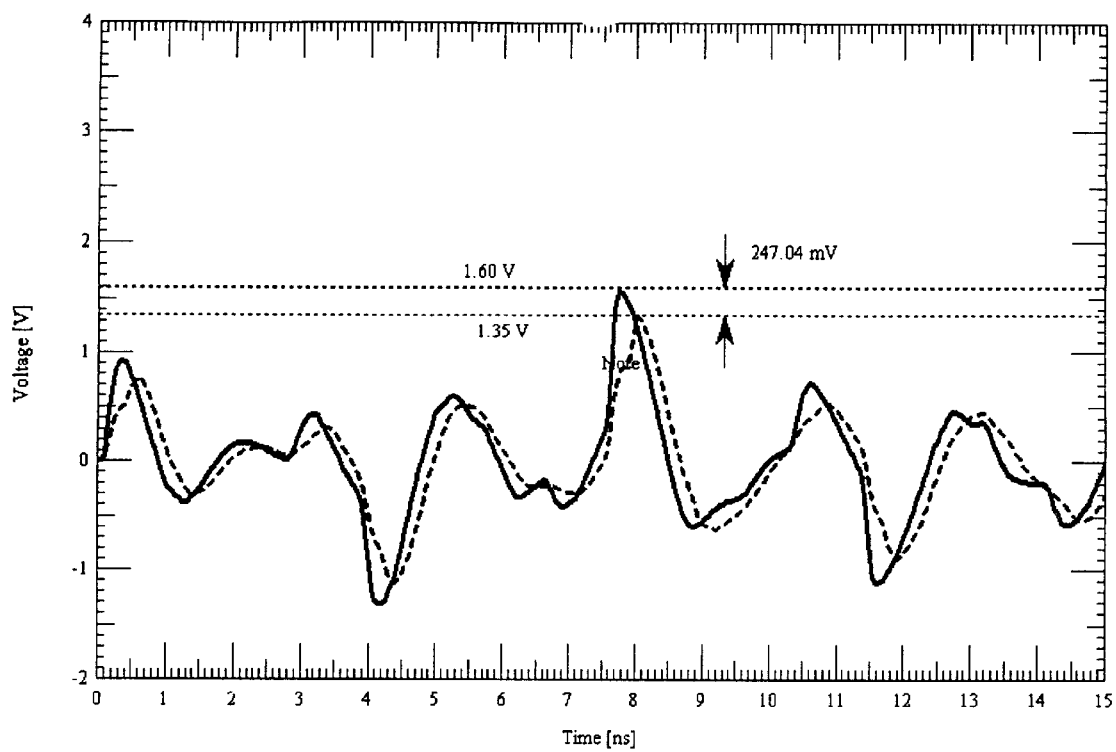
FIG. 2 is a graph illustrating the reduction in ground bounce on a representative IC ground plane accomplished by the embodiment of FIG. 1.

FIG. 2 is a graph illustrating the difference in ground bounce on a representative IC package ground plane with all buffers switching simultaneously (solid black) versus half of the buffers switching at a time with a delay of 300 picoseconds therebetween. The ground bounce reduction is on the order of 15%.

Figure 3:
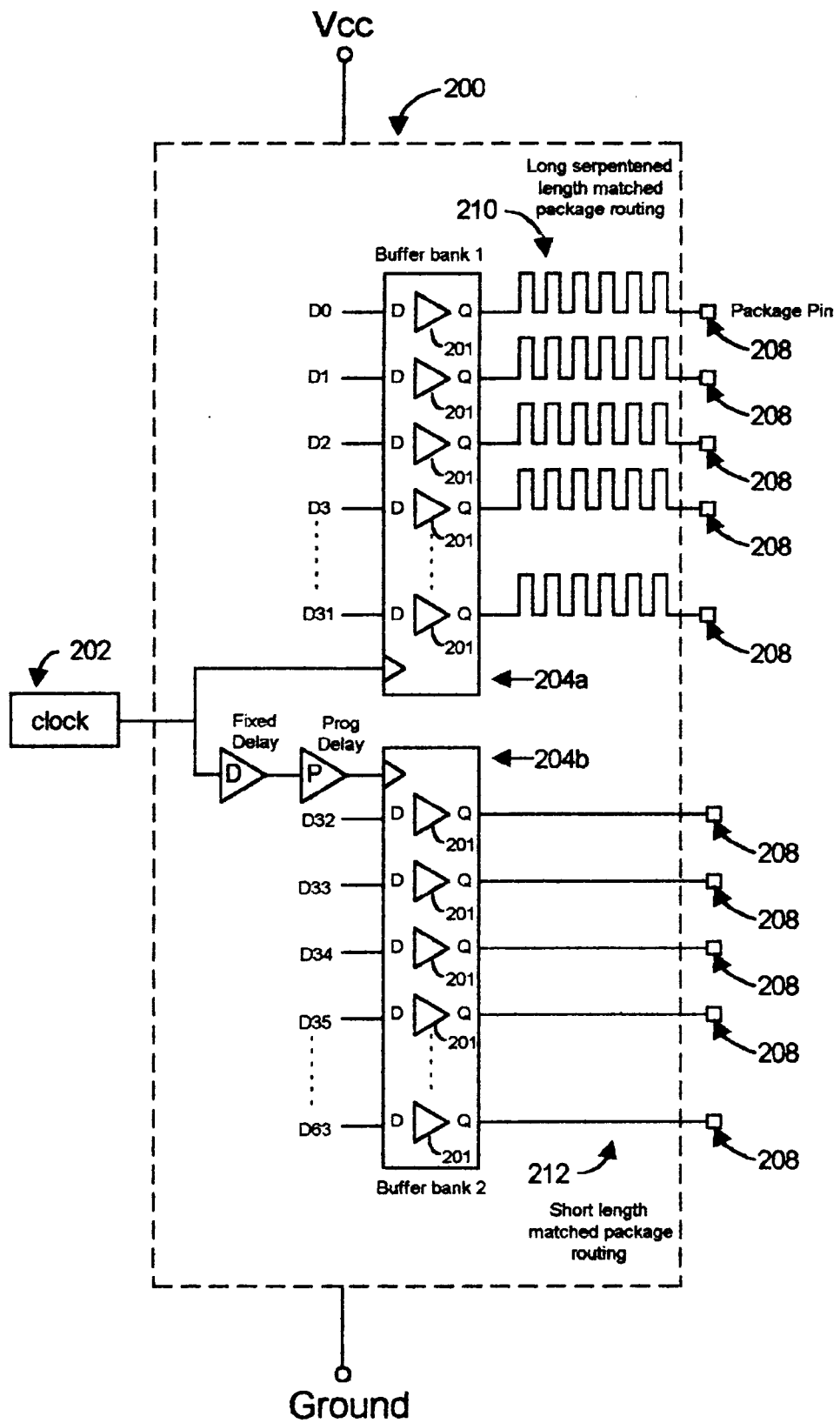
FIG. 3 is a schematic diagram of a buffer implementing a ground bounce reduction technique embodying features of an alternative embodiment.

In an alternative embodiment, illustrated in FIG. 3, an additional, programmable clock delay P could be provided in addition to the delay D to allow for greater phase delay values to be selected by the system designer that can then be de-skewed by additional trace length on the printed circuit board ("PCB").

Figure 4:
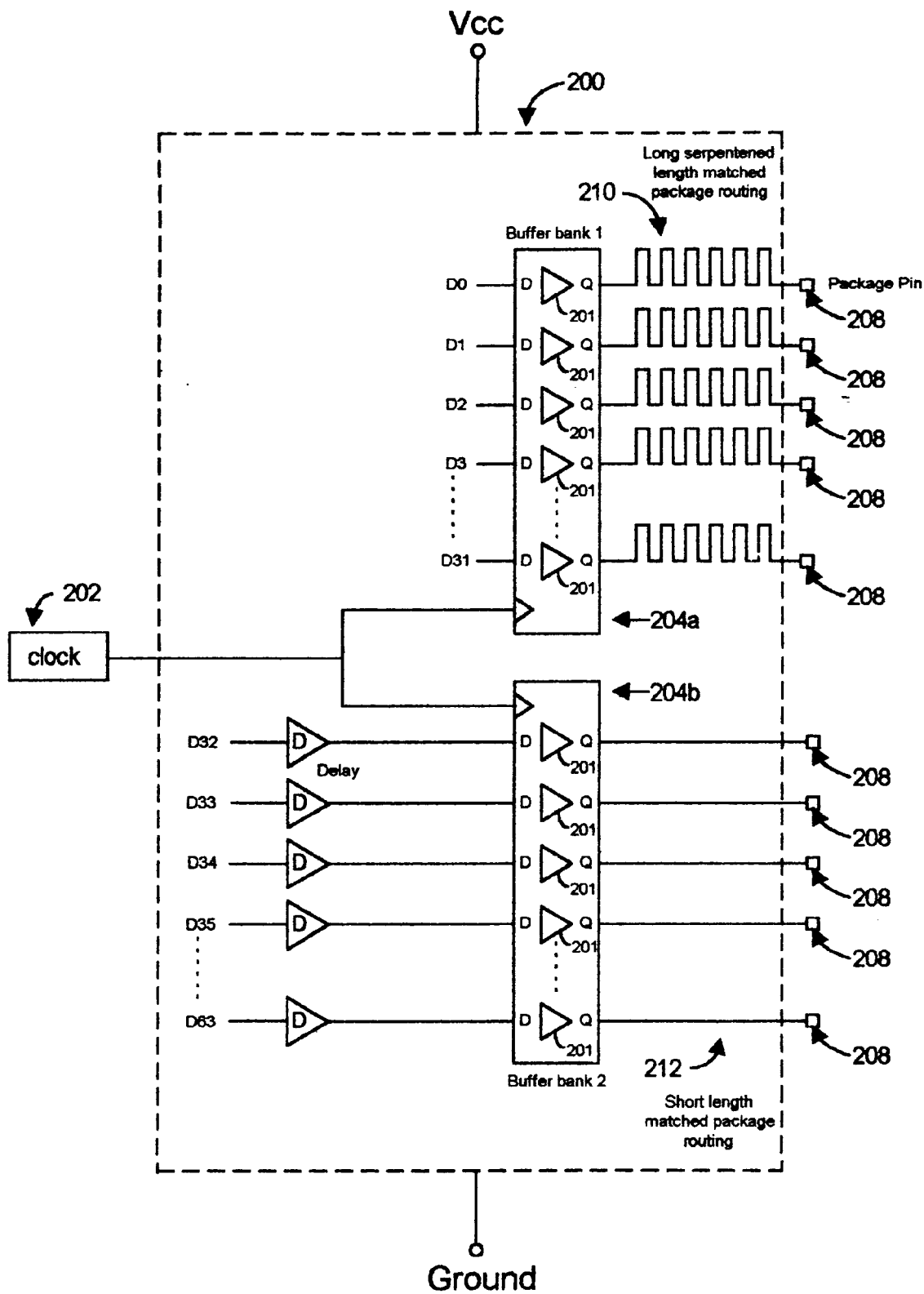
FIG. 4 is a schematic diagram of a buffer implementing aground bounce reduction technique embodying features of another alternative embodiment.

In another embodiment, illustrated in FIG. 4, a result similar to that described above with reference to FIG. 2 is achieved by delaying each individual data signal on the input side. Such a delay could be induced in the same fashion as the other embodiments (i.e., by delaying the clock signal) or in some other fashion, for example, using a capacitor or R/C network.

As previously noted, the use of long phase delay periods on the order of the ground bounce resonance period have been suggested, but such "solutions" do not include trace de-skewing. In fact, it would not be practical to de-skew one to two nanosecond phase delays on an IC package and would be difficult to accomplish even on the PCB. This technique shows promise for on-chip phase delays on the order of 200–300 picoseconds, which are much easier to de-skew. Possible variations are to use more than two phases, but still keeping the total phase delay within the practical limitations of chip substrate routing or the outer loop timing of the source synchronous bus, if necessary. The main reduction in ground bounce is caused by spreading the current impulse to the plane over time, thereby reducing its peak value and thereby the amplitude of the ground bounce.

As can be seen, the principal advantage of the embodiments is that they reduce the amount of ground bounce caused when several I/O buffers drive their outputs simultaneously in a manner that includes phase de-skewing, thus eliminating the necessity to revise bus timing and protocol.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. A method of reducing ground bounce caused by simultaneous switching of a plurality of buffers in an integrated circuit, the method comprising:

delaying input of data to at least one of the plurality of buffers; and deskewing output of the data from each of the at least one of the plurality of buffers prior to outputting the data on a respective output pin of the integrated circuit, such that the data output from each of the at least one of the plurality of buffers appears at the respective output pin of the integrated circuit at the same time as data output from the remaining ones of the plurality of buffers appears at respective output pins of the integrated circuit.

2. The method of claim 1 wherein the delaying further comprises:

dividing the plurality of input buffers into first and second groups of buffers;

at a first time T, inputting data to buffers comprising the first group of buffers; and at a second time T+D, where D is a time delay, inputting data to buffers comprising the second group of buffers.

3. The method of claim 1 wherein the deskewing is accomplished using package routing such that the data output from the at least one of the plurality of buffers reaches a respective output pin of the integrated circuit at the same time as data output from the remaining ones of the plurality of buffers.

4. The method of claim 1 wherein the delaying is accomplished using a fixed clock delay.

5. The method of claim 2 wherein the deskewing is accomplished by serpentining and length-matching traces from the outputs of the first group of buffers to respective output pins of the integrated circuit to create trace-induced delays that match the delay D, while the traces from the outputs of the second group of buffers to respective output pins of the integrated circuit are length-matched and routed as short as possible.

6. The method of claim 2 wherein the delay D is a fixed clock delay.

7. The method of claim 1 wherein the delaying further comprises:

dividing the plurality of input buffers into first and second groups of buffers;

at a first time T, inputting data to buffers comprising the first group of buffers; and at a second time T+D+P. where D is a fixed time delay and P is a programmable time delay, inputting data to buffers comprising the second group of buffers.

8. Apparatus for reducing ground bounce caused by simultaneous switching of a plurality of buffers in an integrated circuit, the apparatus comprising:

means for delaying input of data to at least one of the plurality of buffers; and means for deskewing output of the data from the at least one of the plurality of buffers prior to outputting the data on a respective output pin of the integrated circuit, such that the data output from the at least one of the plurality of buffers appears at the respective output pin of the integrated circuit at the same time as data output from the remaining ones of the plurality of buffers appears at respective output pins of the integrated circuit.

9. The apparatus of claim 8 wherein the means for delaying further comprises:

means for dividing the plurality of input buffers into first and second groups of buffers;

means for inputting data to buffers comprising the first group of buffers at a first time T; and means for inputting data to buffers comprising the second group of buffers at a second time T+D, where D is a time delay.

10. The apparatus of claim 8 wherein the means for deskewing comprises package routing such that the data output from the at least one of the plurality of buffers reaches a respective output pin of the integrated circuit at the same time as data output from the remaining ones of the plurality of buffers.

11. The apparatus of claim 8 wherein the means for delaying comprises a fixed clock delay.

12. The apparatus of claim 9 wherein the means for deskewing comprises serpentining and length-matching traces from the outputs of the first group of buffers to respective output pins of the integrated circuit to create trace-induced delays that match the delay D, while the traces from the outputs of the second group of buffers to respective output pins of the integrated circuit are length-matched and routed as short as possible.

13. The apparatus of claim 9 wherein the delay D is a fixed clock delay.

14. The apparatus of claim 8 wherein the means for delaying further comprises:

means for dividing the plurality of input buffers into first and second groups of buffers;

means for inputting data to buffers comprising the first group of buffers at a first time T; and means for inputting data to buffers comprising the second group of buffers at a second time T+D+P, where D is a fixed time delay and P is a programmable time delay.

15. A method of reducing ground bounce caused by simultaneous switching of a plurality of buffers in an integrated circuit, the method comprising:

dividing the plurality of buffers into two banks of buffers;

inputting data to buffers comprising a first one of the at least two banks of buffers at a first time T;

inputting data to buffers comprising a second one of the at least two banks of buffers at a second time T+D, where D is a time delay; and deskewing output of the data from the buffers of the first one of the at least two banks of buffers prior to outputting the data on respective output pins of the integrated circuit using package routing, such that the data output from all of the plurality of buffers appears at a respective output pin of the integrated circuit at the same time.

16. The method of claim 15 wherein the deskewing is accomplished by serpentining and length-matching traces from the outputs of the buffers comprising the first one of the at least two banks of buffers to respective output pins of the integrated circuit to create trace-induced delays that match the delay D, while the traces from the outputs of the buffers comprising the second one of the at least two banks of buffers to respective output pins of the integrated circuit are length-matched and routed as short as possible.

17. The method of claim 15 wherein D is a fixed time delay.

18. The method of claim 15 wherein D is a programmable time delay.

19. A method of reducing ground bounce caused by simultaneous switching of a number N of buffers in an integrated circuit, the method comprising:

inputting data to a first one of the N buffers at a time T;

for each of the remaining N−1 buffers, inputting data to the buffer a time $T+D_N$, where $D_N$ is a fixed time delay associated with the buffer; and deskewing data output from each of the N buffers prior to outputting the data on respective output pins of the integrated circuit, such that the data output from each of the N buffers appears at its respective output pin at the same time as the data output from the other buffers.

20. The method of claim 18 wherein the value of $D_N$ for each of the remaining N−1 buffers is unique.

\* \* \* \* \*